(12) United States Patent
Nakao

(10) Patent No.: US 6,388,731 B1
(45) Date of Patent: May 14, 2002

(54) PROJECTION ALIGNER AND EXPOSURE METHOD USING THE SAME

(75) Inventor: Shuji Nakao, Hyogo (JP)

(73) Assignee: Mitsubishi Denki Kabushiki Kaisha, Tokyo (JP)

(\*) Notice: Subject to any disclaimer, the term of this patent is extended or adjusted under 35 U.S.C. 154(b) by 0 days.

(21) Appl. No.: 09/670,809

(22) Filed: Sep. 28, 2000

Related U.S. Application Data

(62) Division of application No. 09/215,924, filed on Dec. 18, 1998, now Pat. No. 6,243,159.

(30) Foreign Application Priority Data

Jul. 14, 1998 (JP) ............................................. 10-198889

(51) Int. Cl.⁷ ........................ G03B 27/52; G03B 27/42; G03B 27/54; G03B 27/32
(52) U.S. Cl. ............................ 355/30; 355/67; 355/53; 355/77
(58) Field of Search .............................. 355/30, 50, 52, 355/53, 67, 77, 72, 75; 430/5, 30

(56) References Cited

U.S. PATENT DOCUMENTS

| | | | |
|---|---|---|---|
| 4,162,825 A | | 7/1979 | Dowty ........................ 350/295 |
| 4,690,528 A | \* | 9/1987 | Tanimoto et al. ........... 353/101 |
| 4,825,247 A | | 4/1989 | Kemi et al. .................... 355/55 |
| 5,883,704 A | | 3/1999 | Nishi et al. .................... 355/67 |
| 6,043,863 A | \* | 3/2000 | Ikeda ........................... 355/53 |

FOREIGN PATENT DOCUMENTS

| | | | |
|---|---|---|---|
| GB | 0867774 A2 | \* | 9/1998 |
| JP | 60-78454 | | 5/1985 |
| JP | 62-69617 | | 3/1987 |
| JP | 9-50954 | | 2/1997 |

OTHER PUBLICATIONS

"Analysis of Nonlinear Overlay Errors by Aperture Mixing Related with Pattern Asymmetry" by Lim et al., SPIE, vol. 3051, pp. 106–115.

\* cited by examiner

*Primary Examiner*—Russell Adams
*Assistant Examiner*—Hung Henry Nguyen
(74) *Attorney, Agent, or Firm*—McDermott, Will & Emery

(57) ABSTRACT

An exposure method for a projection aligner is disclosed which enables formation of a highly accurate and fine pattern by suppression of the occurrence of aberrations due to the weight of the optical members. Embodiments include adjusting pressures in first and second spaces in a cylindrical member, separated while being kept in an air-tight state by an optical member held in the cylindrical member, to cause a force having substantially the same magnitude as the weight of the optical member to work on the optical member in an opposite direction to gravity; and irradiating a mask on which a pattern is formed and projecting an image of the pattern onto a photosensitive material through the first and second spaces and the optical member while the pressures in the first and second spaces are adjusted.

2 Claims, 5 Drawing Sheets

PROJECTION ALIGNER AND EXPOSURE METHOD USING THE SAME

This application is a Divisional of application Ser. No. 09/215,924 filed Dec. 18, 1998 now U.S. Pat. No. 6,243,159.

BACKGROUND OF THE INVENTION

1. Field of the Invention

The present invention relates to a projection aligner and an exposure method using the same. More particularly, the present invention relates to a projection aligner for projecting a mask pattern and an exposure method using the same.

2. Description of the Background Art

A conventional projection aligner will be first described in the following.

FIG. 4 is a schematic view showing the structure of a conventional projection aligner. Referring to FIG. 4, the conventional projection aligner demagnifies a pattern on a reticle (mask) 11 and projects it onto a photo resist (photosensitive material) on a wafer 20, and has a light source 13, an illumination optical system 12 from light source 13 to reticle 11, and a projection optical system 110 from reticle 11 to wafer 20.

Specifically, projection optical system 110 has a lens barrel 101 and a plurality of lenses 102a to 102e arranged in lens barrel 101.

In the exposing operation, a light beam emitted from light source 13 is first projected through illumination optical system 12 onto reticle 11 on which a pattern is formed. The pattern image thus produced is projected onto the photo resist applied to wafer 20 through lenses 102a to 102e in projection optical system 110.

Here, the reference character AX in the figure denotes the optical axis of the light beam emitted from light source 13.

In manufacturing semiconductor integrated circuits, projection aligners are extensively employed to form fine patterns. For the recent demand for finer patterns, the exposure wavelength has become smaller to the g ray (436 nm), the i ray (365 nm) and further to the KrF excimer laser light beam (248 nm). Further, in order to form patterns of at most the wavelength of an exposure light beam, such super-resolution technique as the use of a phase shift mask is required.

Since the phase shift mask is a technique to improve resolution by interference of a light beam in an opposite phase, the light beam interference has to be large to some extent. Thus, the interference between mask apertures is generally made larger to attain its effect in the super-resolution technique. It is therefore necessary to carry out exposure by increasing the interference of illumination (reducing the "σ (coherency) value"). In this case, an image may be formed by the interference using only part of a pupil, and this increases the influence of aberration as distortion of a lens and deteriorates the imaging property.

Although the lens aberration is attributable to the accuracy of polishing the lens, lens form distortion due to the lens weight after assembling a projection aligner is also one of the major causes in the conventional projection aligner.

For example, for a parallel plate lens 2 arranged in lens barrel 101 as shown in FIG. 5, its own weight causes the central portion of the lens to bend more than the peripheral portion in a direction in which gravity works. When lens 2 does not bend, the path A of a beam passing through lens 2 is linear. However, the path B of a beam passing through bent lens 2 is refracted by lens 2 and is not linear. Thus, the beam is displaced, causing aberration.

Such aberration causes the following effects in forming device patterns.

Pattern displacement due to comma is one example. Hole patterns and interconnection patterns are used in LSIs (Large Scale Integrated circuits). As shown in FIG. 6, the structure in which a hole 26 for electrically connecting a lower layer interconnection 22 and an upper layer interconnection 28 passes through an intermediate layer interconnection 24 is generally used. In this structure, hole 26 is formed in interlayer insulating films 23, 25. Hole 26 is filled with a conductive layer 27, and lower layer interconnection 22 is formed on a silicon substrate 21, for example.

In the structure shown in FIG. 6, when relative displacement between hole 26 and intermediate layer interconnection 24 is caused by aberration while a pattern is transferred, conductive layer 27 filling hole 26 and intermediate later interconnection 24 may be electrically short-circuited.

When the displacement due to aberration during pattern transfer is uniform in the exposure field, the influence of displacement due to aberration is substantially eliminated if exposure is carried out by deliberately shifting the amount of displacement during overlay exposure. In an actual stepper, however, the amount of displacement (including the directions) due to aberration is non-uniformly distributed in the field. Further, since displacement varies from one pattern to another (due to the pitch of a line/space pattern, for example), eliminating this effect is considered to be difficult. Even in a portion having the same patterns and the same image fields, the hole patterns and the interconnection patterns are relatively displaced by changing the exposure method (for example, modified illumination and normal illumination).

In order to form patterns not to cause such an electric short circuit, therefore, the space between hole 26 and intermediate layer interconnection 24 has to be widely designed. Then, the patterns can not be arranged closely, the chip size becomes larger, the number of production per wafer decreases, and production is lowered.

The typical amount of relative displacement for an actual stepper is considered to be 20–30 nm with a device having a 0.20 μm rule. Since the amount of displacement (conventional "overlay error" not caused by aberration) when the same patterns are overlayed and exposed under the same exposure conditions is 40–50 nm, such displacement between patterns that can not be ignored is caused by aberration.

FIG. 3 of C. M. Lim "Analysis of nonlinear overlay errors by aperture mixing related with pattern asymmetry", SPIE Vol. 3051, pp. 106–115 shows the distribution, in an exposure field, of displacement between large size (~10 μm□) patterns due to a difference in the type of illumination (modified illumination). FIG. 3(a) is the measured amount of displacement, and FIG. 3(b) shows the amount of displacement without a parallel movement component and a magnification error component (the amount of displacement which can not be corrected by a stepper when the second layer is exposed). It can also be seen from this figure that the amount of displacement which can not be corrected is at most 30 nm.

SUMMARY OF THE INVENTION

An object of the present invention is to provide a projection aligner capable of forming a highly-accurate and fine pattern by suppressing occurrence of aberration due to the weight of a lens itself and an exposure method using the same.

A projection aligner of the present invention for irradiating a mask, on which a pattern is formed, with an energy ray and projecting the image of the pattern onto a photosensitive material through a projection optical system includes a cylindrical member, an optical member and pressure adjusting means. The cylindrical member passes the image of the pattern. The optical member is held in the cylindrical member to separate first and second spaces in the cylindrical member while the first and second spaces are kept in an air-tight state. The pressure adjusting means adjusts the pressures in the first and second spaces so that force having substantially the same magnitude as gravity working on the optical member works on the optical member in an opposite direction to the gravity.

Since the force can be caused to work on the optical member to cancel its gravity in the projection aligner of the present invention, distortion of the optical member form due to its own weight and occurrence of aberration according to the distortion are suppressed. Therefore, a fine pattern can be formed.

In the above described projection aligner, the pressure adjusting means is preferably formed to be able to adjust the pressures in the first and second spaces so that the product of a pressure difference between the first and second spaces and an optical member area is substantially the same as the gravity working on the optical member.

Thus, the force for canceling the weight of the optical member can be produced by the pressure adjusting means.

In the above described projection aligner, the pressure adjusting means is preferably formed to be able to adjust the pressures in the first and second spaces following a thermal change in the optical member due to exposure.

Thus, even if the optical member is heated with light irradiation and transformed during exposure, the pressure working on the optical member is adjusted accordingly. Therefore, a thermal change in the optical member is prevented. Accordingly, aberration due to a thermal change is suppressed and a finer pattern can be formed.

The above described projection aligner preferably further includes a second optical member held in the cylindrical member so that one surface faces the inner space of the cylindrical member, the other surface faces the outer space of the cylindrical member and the second optical member is positioned closer to a photosensitive material than the optical member, and the second optical member has a form having its central portion projecting more than its peripheral portion toward the inner space of the cylindrical member.

Thus, transformation of the second optical member of which own weight can not be canceled by the pressure adjusting means can be suppressed.

Preferably, the above described projection aligner further includes a second optical member held in the cylindrical member so that one surface faces the inner space of the cylindrical member, the other surface faces the outer space of the cylindrical member and the second optical member is positioned closer to a photosensitive material than the optical member, and the portion of the cylindrical member for holding the optical member is smaller than the portion of the cylindrical member for holding the second optical member in inner diamer.

Thus, transformation of the second optical member of which own weight can not be canceled by the pressure adjusting means can be suppressed.

An exposure method using the projection aligner of the present invention includes the following steps.

First, pressures in first and second spaces in a cylindrical member, which are separated while being kept in an air-tight state by an optical member held in the cylindrical member, are adjusted by pressure adjusting means to cause force having substantially the same magnitude as gravity working on the optical member to work on the optical member in an opposite direction to the gravity. While the pressures in the first and second spaces are adjusted, a mask on which a pattern is formed is irradiated with an energy ray and the image of the pattern is projected onto a photosensitive material through the first and second spaces and the optical member.

Since the force is caused to work on the optical member to cancel its weight in the exposure method using the projection aligner of the present invention, distortion of the optical member form due to its own weight and occurrence of aberration according to the distortion are suppressed. Therefore, a fine pattern can be formed.

In the above described exposure method using the projection aligner, the pressures in the first and second spaces are preferably adjusted by the pressure adjusting means so that the product of a pressure difference between the first and second spaces and an optical member area is substantially the same as the gravity working on the optical member.

Thus, the force for canceling the weight of the optical member can be produced by the pressure adjusting means.

In the above described exposure method using the projection aligner, the pressures in the first and second spaces are preferably adjusted by the pressure adjusting means following a thermal change in the optical member due to exposure.

Thus, even if the optical member is heated with light irradiation and transformed during exposure, the force working on the optical member is adjusted accordingly. Therefore, a thermal change in the optical member is prevented. Accordingly, aberration due to a thermal change is suppressed and a finer pattern can be formed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will be described below with reference to the figures.

Figure 1:
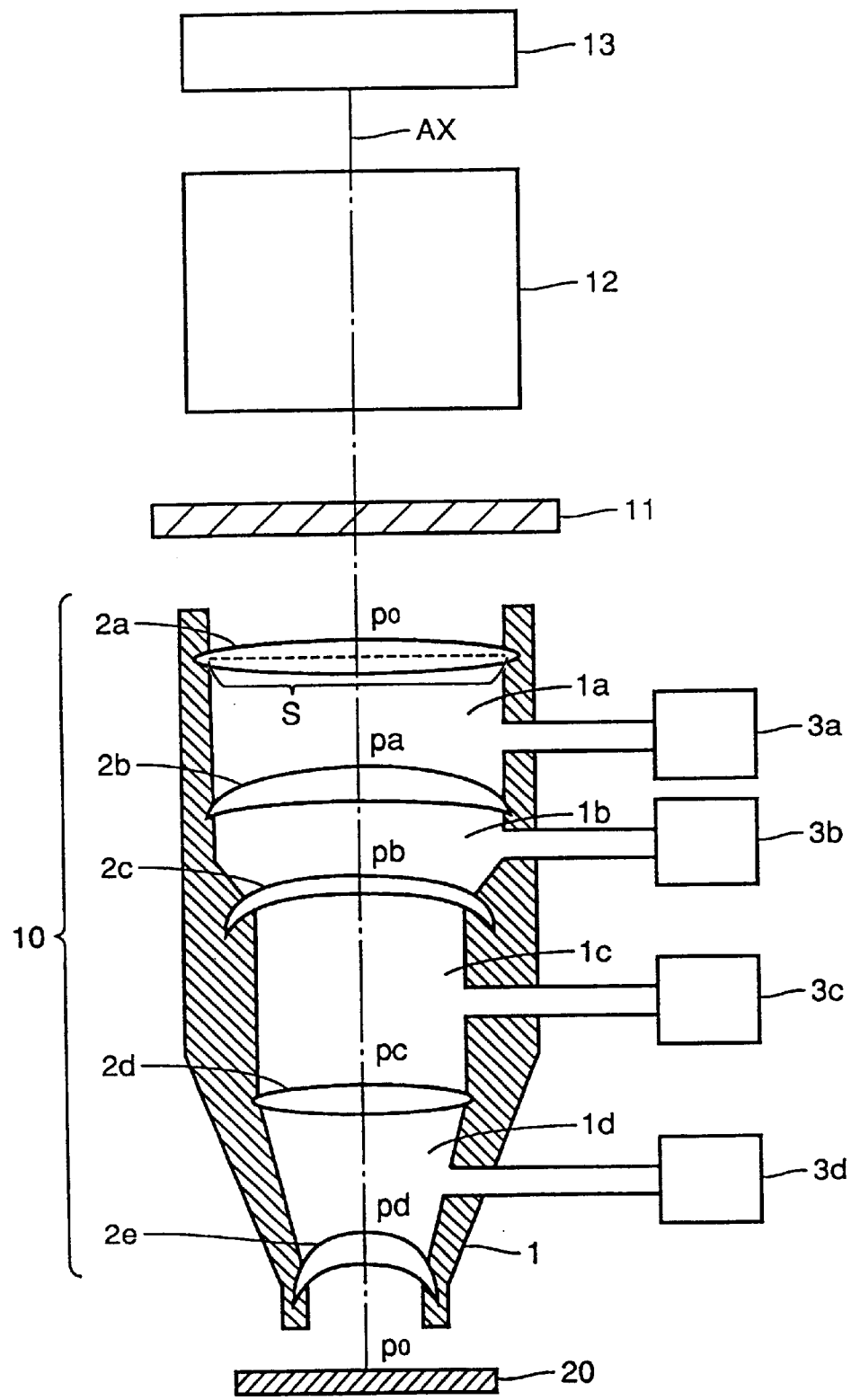
FIG. 1 is a schematic view showing the structure of a projection aligner in a first embodiment of the present invention.

Referring to FIG. 1, a projection aligner in this embodiment demagnifies a pattern on a reticle (mask) 11 and projects it onto a photo resist (photosensitive material) on a wafer 20. The projection aligner has a light source 13, an illumination optical system 12 from light source 13 to reticle 11, and a projection optical system 10 from reticle 11 to wafer 20.

Specifically, projection optical system 10 has a lens barrel 1, lenses 2a to 2e, and pressure adjusting apparatuses 3a to 3d. Lenses 2a to 2e are held in lens barrel 1 to separate the inner space of lens barrel 1 and to keep the inner spaces 1a to 1d of lens barrel 1 in an air-tight state. Pressure adjusting apparatuses 3a to 3d are provided to be coupled to inner spaces 1a to 1d.

Pressure adjusting apparatuses 3a to 3d are formed to be able to apply pressures to inner spaces 1a to 1d to which the apparatuses are coupled. When gravity works toward the lower side in the figure, the pressures are adjusted so that the product of a pressure difference between upper and lower spaces separated by a lens and a lens area is substantially the same as a lens weight. In short, when the lens area is S, the pressures in the upper and lower spaces over and under the lens are $p_1$ and $p_2$, and the lens weight is W, the pressures of the upper and lower spaces are adjusted to satisfy the following relation.

$$(p_2-p_1) \times S = W \tag{1}$$

Here, the lens area S refers to a projection area such as the area of a portion denoted by a dotted line which can pass a light beam in lens 2a.

By thus adjusting the pressures of inner spaces 1a to 1d, the weight of each lens is cancelled and distortion of the lens form due to its own weight becomes ignorable.

However, the space over uppermost lens 2a and the space under lowermost lens 2e both have the same external air pressure $p_0$. When pressures $p_a$, $p_b$, $p_c$, $p_d$ are adjusted to cancel the weights of uppermost lens 2a and other lenses 2b, 2c, 2d, therefore, pressure $p_d$ in the space over lowermost lens 2e becomes larger than pressure $p_0$ in the space under lowermost lens 2e. Accordingly, the weight of lowermost lens 2e can not be supported by a pressure difference between the spaces over and under lens 2e. Further, the pressure works in a direction to increase the weight of lowermost lens 2e.

Meanwhile, when pressure $p_d$, $p_c$, $p_b$, $p_a$ are adjusted to cancel the weights of lowermost lens 2e and other lenses 2d, 2c, 2b, pressure $p_a$ in the space under uppermost lens 2a becomes smaller than pressure $p_0$ in the space over uppermost lens 2a. Accordingly, the weight of uppermost lens 2a can not be supported by a pressure difference between the spaces over and under uppermost lens 2a. Further, the pressure works in a direction to increase the weight of uppermost lens 2a.

As described above, the weight of the lens itself can not be cancelled for either of uppermost lens 2a or lowermost lens 2e. Since an image has to be demagnified more as it is closer to wafer 20 in a demagnification projection aligner, lowermost lens 2e has a smaller lens diameter than uppermost lens 2a. It can be seen from the relation of the above described formula (1), the degree of increasing the lens weight is smaller in lowermost lens 2e than uppermost lens 2a. Therefore, lowermost lens 2e is more preferred than uppermost lens 2a as a lens of which weight can not be canceled.

Even in this case, any distortion of the form of lowermost lens 2e causes various aberration, making it difficult to accurately form a fine pattern. In this case, lowermost lens 2e has to be formed so that it hardly transforms. Therefore, lowermost lens 2e preferably has a form having its central portion projecting more than its peripheral portion toward the inner space of lens barrel 1 as shown in FIG. 1, for example, or has a thick parallel plate form as shown in FIG. 2.

When the total weight of lenses 2a to 2d of projection optical system 10 is 10 kg in this case, lowermost lens 2e has a load of its own weight +10 kg. Since the diameter of parallel plate lowermost lens 2e is about 10 cm, the thickness of parallel plate lowermost lens 2e has to be set so that distortion of the parallel plate (quarts circular plate) having a diameter of 10 cm when it is supported at its periphery is at most 0.01 μm.

Figure 2:
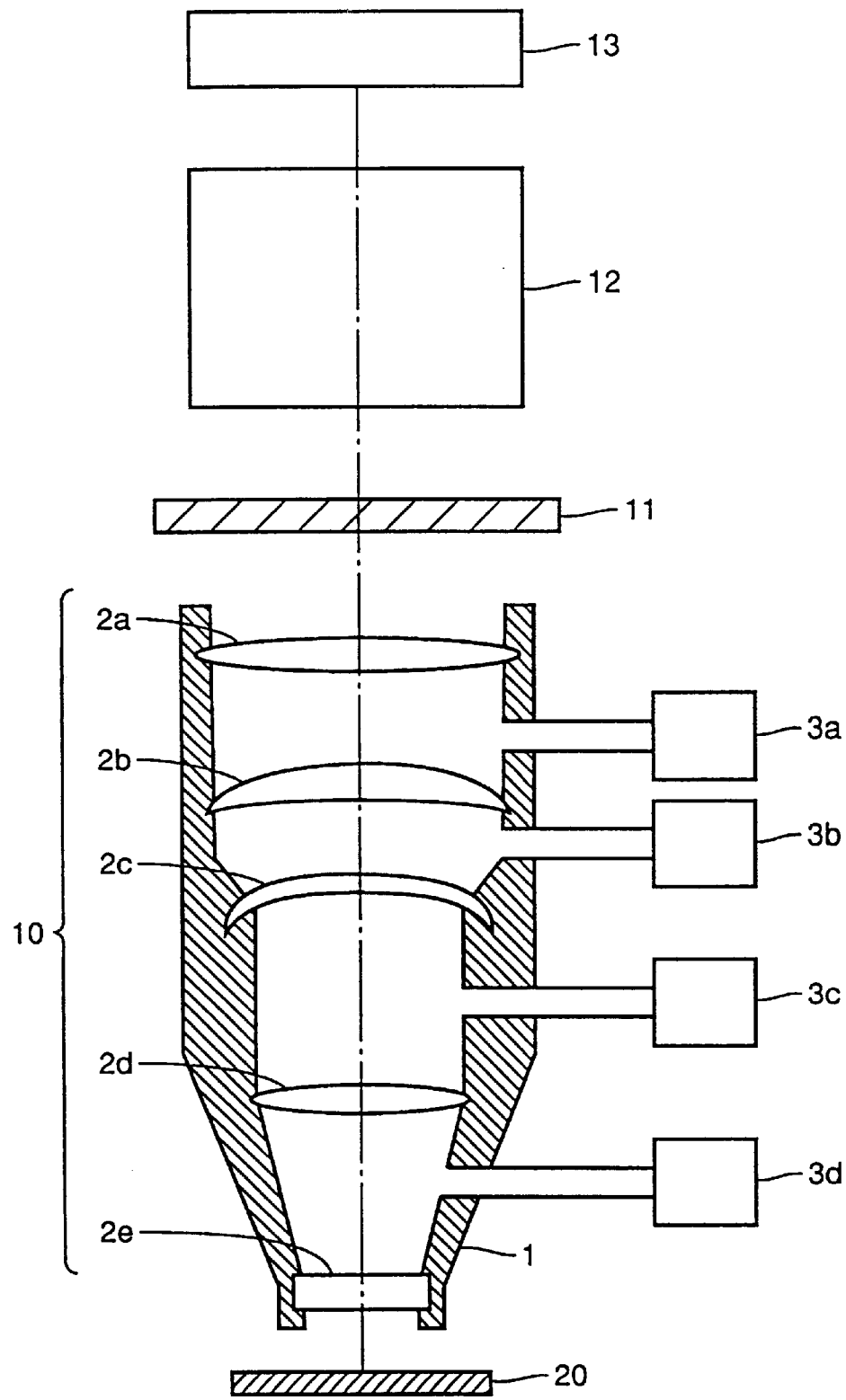
FIG. 2 is a schematic view showing the structure of a projection aligner in another embodiment of the present invention.

Since other parts in FIG. 2 are almost the same as the structure in FIG. 1, the same members are denoted by the same reference characters and the description will not be repeated.

At the time of exposure, lenses 2a to 2e are heated with light irradiation and they tend to cause thermal transformation. When the thermal transformation is caused, distortion due to transformation leads to aberration, making it difficult to form a highly-accurate and fine pattern as described above.

Therefore, pressure adjusting apparatuses 3a to 3d are formed to be able to adjust the pressures in inner spaces 1a to 1d following the thermal transformation in lenses 2a to 2d. Thus, occurrence of aberration due to thermal transformation over time during exposure can be prevented, and a highly-accurate and fine pattern can easily be formed.

In the exposure operation of the projection aligner in this embodiment, a light beam emitted from light source 13 first passes through illumination optical system 12, and it is directed uniformly on the entire surface of reticle 11 on which a prescribed pattern is formed. Thereafter, the image of the pattern is projected onto a photo resist on wafer 20 through lenses 2a to 2e in projection optical system 10.

The exposed photo resist is patterned by being developed. When a film, to be etched, of wafer 20 is etched by using the patterned photo resist as a mask, a pattern is formed on the film to be etched. Thereafter, the resist pattern is removed.

When exposure is carried out by using the projection aligner in this embodiment, aberration due to the weight of the lens itself can be reduced and therefore a fine and highly-accurate pattern can be formed as described in detail below.

Figure 3:
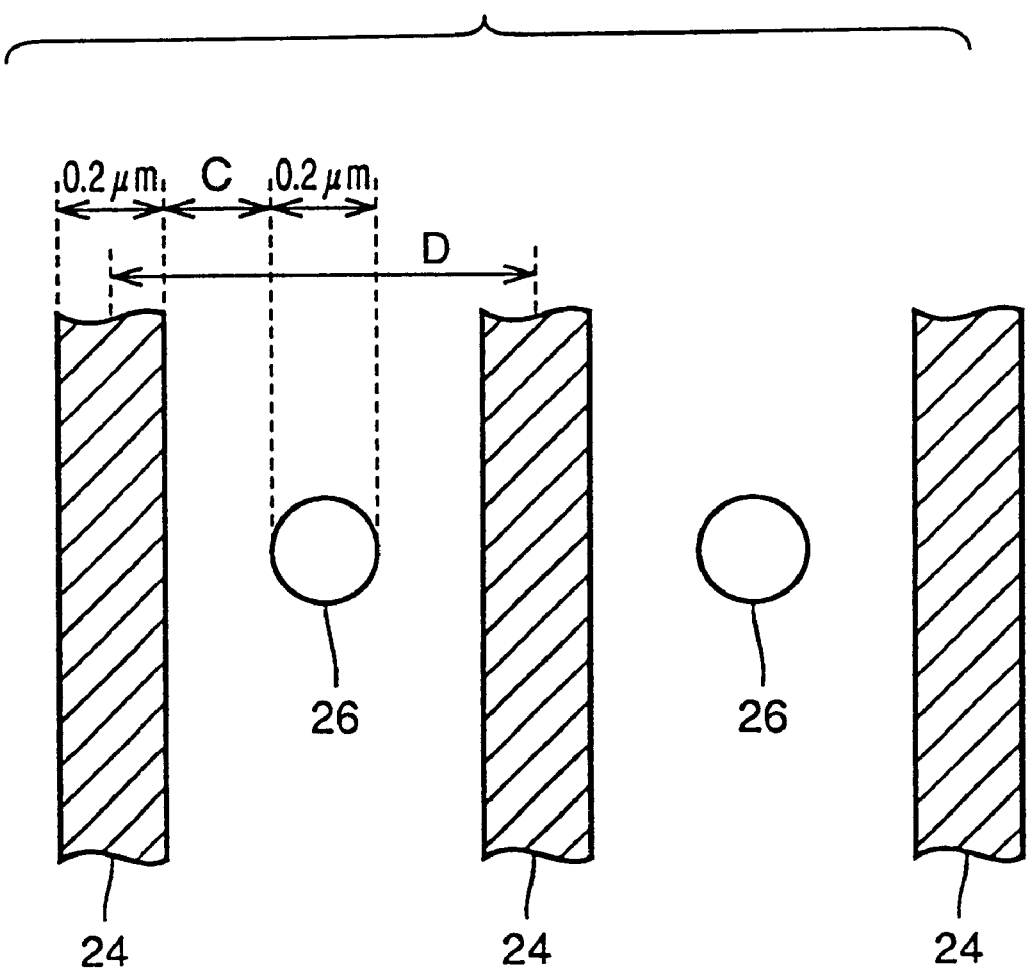
FIG. 3 is a plan view showing the pattern arrangement of an interconnection and a hole.
Figure 4:
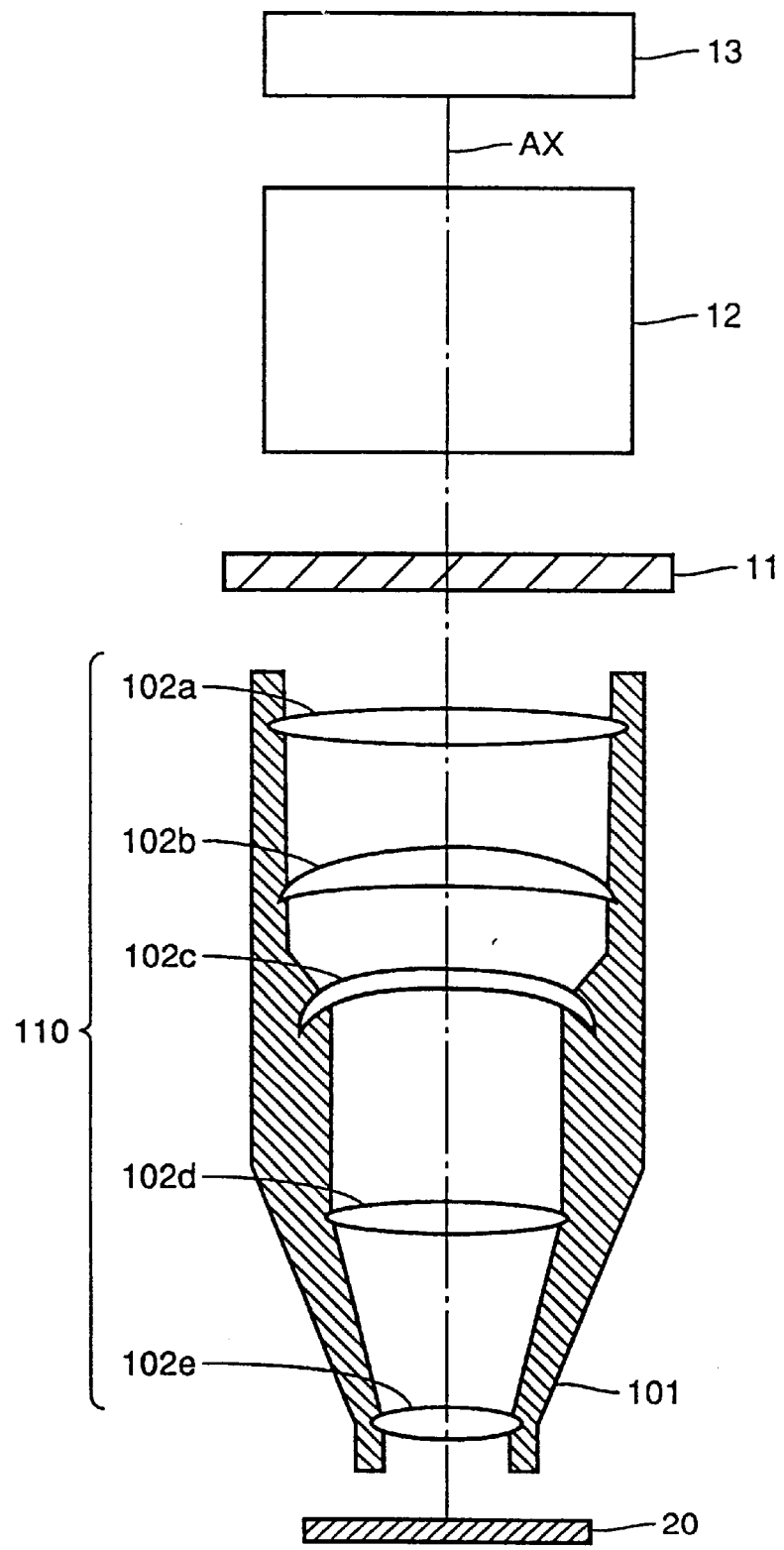
FIG. 4 is a schematic view showing the structure of a conventional projection aligner.
Figure 5:
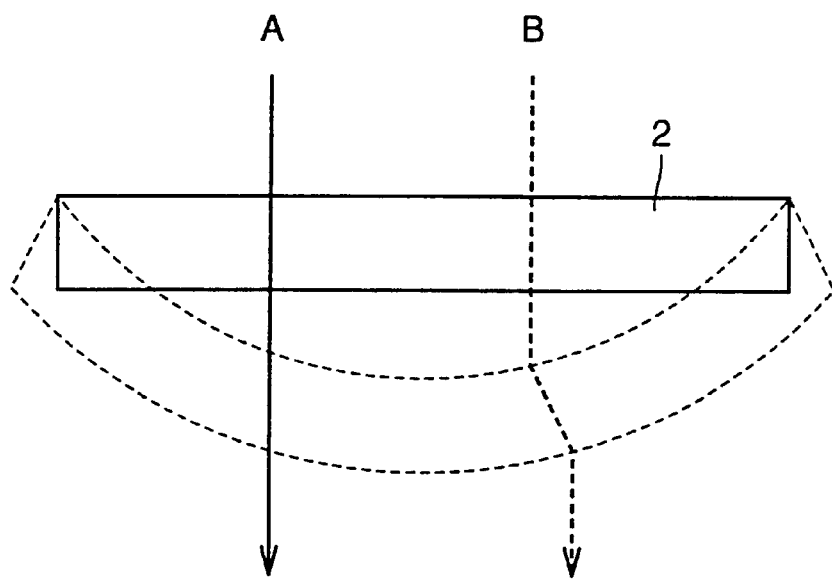
FIG. 5 shows a case in which an optical member such as a lens is bent due to its own weight.
Figure 6:
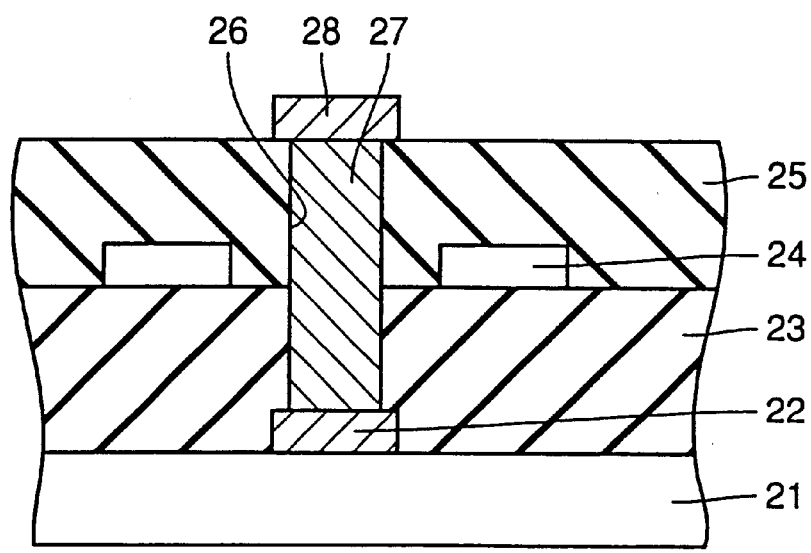
FIG. 6 is cross sectional view of a device showing a hole which is formed between interconnections.

Referring to FIG. 3, when aberration is caused as in a conventional projection aligner, the space C between an interconnection 24 and a hole 26 requires the dimension of aberrational movement 30 nm+overlay displacement 40 nm+manufacturing error 20 nm=90 nm. When aberration is caused, therefore, the repeated pitch D of interconnection 24 and hole 26 is 200 nm (width of interconnection 24)+200 nm (diameter of hole 26)+180 nm=580 nm.

However, since aberration can be eliminated when the projection aligner in this embodiment is used, the dimension C is overlay displacement 40 nm+manufacture error 20 nm=60 nm. Therefore, the repeated pitch D is 200 nm+200 nm+120 nm=520 nm. When the projection aligner in this embodiment is used in this manner, aberration can be eliminated. Accordingly, a closer pattern arrangement can be attained than in a conventional projection aligner, and a device having a fine and highly-accurate pattern can be obtained.

It is noted in this embodiment that the pressure can be adjusted to cancel the weight of the optical member itself not only for a lens but for other optical members.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An exposure method, comprising the steps of:

adjusting pressures in first and second spaces in a cylindrical member, separated while being kept in an airtight state by an optical member held in said cylindrical member, to cause force having substantially the same magnitude as gravity working on said optical member to work on said optical member in an opposite direction to said gravity; and irradiating a mask on which a pattern is formed with an energy ray and projecting an image of said pattern onto a photosensitive material through said first and second spaces and said optical member while the pressure in said first and second spaces are adjusted;

wherein the pressures in said first and second spaces are adjusted so that a product of a pressure difference between said first and second spaces and an area of said optical member for passing the energy ray is substantially the same as the gravity working on said optical member.

2. The exposure method according to claim 1, wherein the pressures in said first and second spaces are adjusted responsive to a thermal change in said optical member.

* * * * *